United States Patent
Keshavarzi et al.

(10) Patent No.: US 6,825,687 B2
(45) Date of Patent: Nov. 30, 2004

(54) SELECTIVE COOLING OF AN INTEGRATED CIRCUIT FOR MINIMIZING POWER LOSS

(75) Inventors: Ali Keshavarzi, Portland, OR (US); Jaume A. Segura, Pallma de Mallorca (ES); Siva G. Narendra, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 10/230,466

(22) Filed: Aug. 29, 2002

(65) Prior Publication Data

US 2004/0041582 A1 Mar. 4, 2004

(51) Int. Cl.$^7$ ................... H03K 17/16; H03K 19/003
(52) U.S. Cl. ................ 326/34; 326/49; 326/101; 326/23
(58) Field of Search ................ 326/58, 34, 49, 326/50, 83, 41, 101, 23; 257/706

(56) References Cited

U.S. PATENT DOCUMENTS 6,169,419 B1 * 1/2001 De et al. ................ 326/58
6,548,894 B2 * 4/2003 Chu et al. ................ 257/706

OTHER PUBLICATIONS

De et al., "Low Power and High Performance Design Challenges in Future Technologies," (invited paper), Aug. 1998.

* cited by examiner

Primary Examiner—Daniel D. Chang
(74) Attorney, Agent, or Firm—Grossman & Flight, LLC

(57) ABSTRACT

An apparatus and method for reducing leakage current of transistors used in an integrated circuit, which selectively switch a processor circuit in the integrated circuit to a standby state. A cooling device is included and selectively located in an area of the integrated circuit that is in close proximity to a transistor used to switch a processor circuit between active and standby states. The cooling device cools the transistor in order to improve both its leakage and active current states, thereby increasing efficiency of the transistor and reducing its leakage current.

23 Claims, 4 Drawing Sheets

US 6,825,687 B2

SELECTIVE COOLING OF AN INTEGRATED CIRCUIT FOR MINIMIZING POWER LOSS

FIELD OF THE DISCLOSURE

This disclosure relates to integrated circuits, and more particularly to a method and apparatus for selectively cooling a leakage control transistor in order to reduce overall standby leakage current therein.

BACKGROUND

With the scaling of semiconductor circuitry in integrated circuits, particularly in metal oxide semiconductor circuits, supply voltages are typically reduced to maintain circuit performance. This scaling, however, requires that the threshold voltages ($V_{TH}$) be scaled as well, which increases the sub-threshold leakage current of metal oxide transistors in the semiconductors circuit. As scaling continues, this sub-threshold leakage current is becoming a more significant fraction of the total power consumption in integrated circuit technologies. Higher leakage currents and, hence, higher power leakage can be particularly problematic for mobile and hand-held applications that utilize battery power sources, for example.

An approach to reducing the amount of power lost due to sub-threshold leakage current has been the use of leakage control transistors (referred to also as "keeper" devices) that disconnect logic blocks of a microprocessor from power or ground rails during standby modes when the digital logic block is disabled (not clocked). This approach utilizes transistor stack effect wherein a series connection of a logic block circuit and a leakage control transistor achieve reduction of leakage current on an order of a magnitude compared to either the logic block or the leakage control transistor on their own. In operation, if the logic block circuit is operated, the keeper device is turned on to power up the logic block. In turn, the standby current drawn by the keeper device determines the standby power dissipated by the logic block that is disabled by the keeper device. The keeper device is typically sized to compromise between a low standby current, thereby minimizing the amount of standby current, and a high saturation current in order to minimize the impact of the keeper device on performance of the digital logic block circuit.

Another approach to reducing leakage power and, hence, the overall power, is to reduce the temperature of the integrated circuit die. In particular, leakage current ($I_{OFF}$) increases exponentially with temperature and, thus, leakage power can be represented as a function of temperature. By reducing transistor circuit junction temperatures, a significant reduction in the sub-threshold leakage currents may be achieved. Moreover, circuits operating at lower temperatures also benefit from higher mobility and, thus, higher saturation currents, which yields higher performance. A disadvantage of presently available cooling solutions, however, is that they are power inefficient. That is, the power required to decrease the circuit temperatures by active cooling is equivalent to or higher than the power savings gained by operating at lower temperature.

DETAILED DESCRIPTION OF THE PREFERRED EXAMPLES

Figure 1:
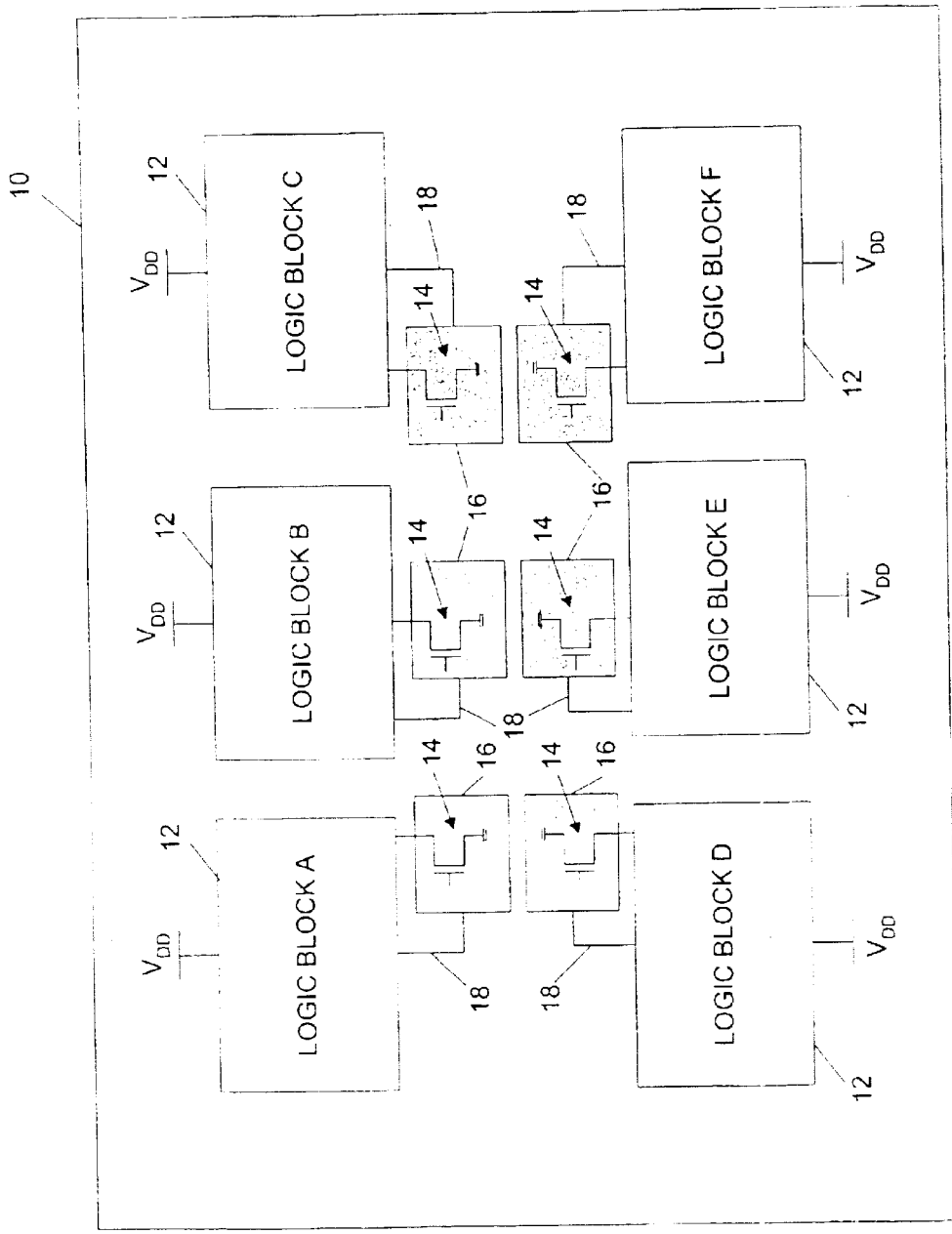
FIG. 1 is a schematic block diagram showing a microprocessor structure having a plurality of logic blocks each with an associated standby leakage transistor with its own selective cooling device.

A microprocessor constructed in accordance with the teachings of the present invention is illustrated in block schematic form in FIG. 1. A microprocessor 10 is shown having a plurality of logic blocks 12. In this example, six logic blocks labeled A-F are shown, but any number of digital logic blocks may be utilized as desired. In the illustrated example, each of the logic blocks 12 includes microprocessor circuitry made up of complimentary metal oxide semiconductors (CMOS). The integrated circuit 10 utilizes digital logic blocks 12 to subdivide the integrated circuit into simpler blocks, for example.

Associated with each of the logic blocks 12 is a leakage control transistor 14 or "keeper" device. In the example of FIG. 1, these keeper devices are N-type MOS transistors (NMOS). The keeper devices 14 are connected in series with their associated logic block 12 between a power supply line $V_{DD}$ and ground. The purpose of the keeper device 14 is to reduce standby leakage current from the logic blocks 12 when in an inactive mode (i.e., when the logic block 12 is not clocked). The series connection of the logic block 12 and keeper device 14 capitalizes on the transistor stack effect, discussed previously, to lower the leakage currents.

Associated with each of the keeper devices 14 within the example integrated circuit 10 shown in FIG. 1 are cooling devices 16 respectively disposed in an area of the integrated circuit 10 that is in close proximity to the keeper devices 14 for the purpose of localized cooling of the circuit junction within the keeper device 14. As discussed previously, decreasing the circuit junction temperature achieves both the benefits of improving mobility of carriers within the transistor and also increasing the threshold voltage ($V_{TH}$), which lowers the sub-threshold leakage current ($I_{OFF}$).

The cooling devices 16 are preferably thermal electric devices utilizing a solid-state method of heat transfer, which may actively cool the keeper devices. An example of a solid-state device that may be used is a device utilizing the Peltier effect where an input of current to such device effects transfer of heat energy from one portion of the device to another, thereby effecting cooling. It is noted that the use of a thermal electric device, such as one utilizing the Peltier effect, is merely an example in that other devices known for cooling small areas, such as micro electro-mechanical systems (MEMS) utilizing, for example, micro channels may be envisioned by those having ordinary skill in the art to achieve cooling for large scale integrated circuits.

The utilization of selective cooling of the keeper devices 14 results in performance enhancement of these devices and controls power leakage of the larger logic blocks 12. Such selective cooling requires less power than cooling the entire integrated circuit 10 or even the logic blocks 12 since it is targeting a very small area of the integrated circuit in proximity with the keeper devices 14. Additionally, the enhanced performance of the keeper devices through selective cooling of these devices impacts the overall standby leakage current of the integrated circuit 10 since the cooling reduces the standby leakage current of the keeper devices 14. A further benefit is that the circuit speed of the logic blocks 12, when operating, is improved because the saturation current ($I_{ON}$) of the keeper devices 14 is increased due to the cooling effects.

Since the cooling devices 16 target a small area of the integrated circuit 10 and, thus, consume minimal power to achieve cooling, these devices 16 may further be driven by power from the logic block circuits 12. As shown in FIG. 1, power connections 18 from the logic blocks 12 to the cooling devices 16 of their respective keeper devices 14 are illustrated. No external source of power is needed for supplying the cooling devices 16. Hence, the example arrangement illustrated in FIG. 1 provides improved power efficiency for cooling.

Figure 2:
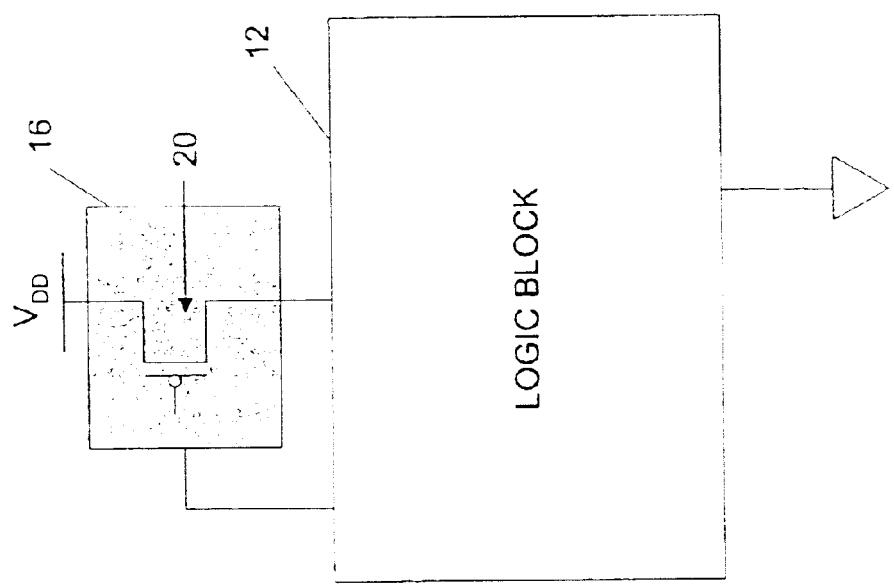
FIG. 2 is a schematic block diagram showing an alternative connection of a microprocessor logic block with a PMOS standby leakage transistor having its own selective cooling device.

Although the example arrangement of FIG. 1 specifically illustrates NMOS transistors for the keeper devices 14, similarly the keeper devices 14 may be PMOS transistors as illustrated in FIG. 2. Here, the PMOS keeper devices 20 are connected in series with their respective logic block 12 between the power source $V_{DD}$ and ground, The PMOS transistor 20 is located between the logic block 12 and the power source $V_{DD}$. In this example, the PMOS transistor 20 is also selectively cooled by cooling device 16 in proximity with the transistor 20.

Figure 3:
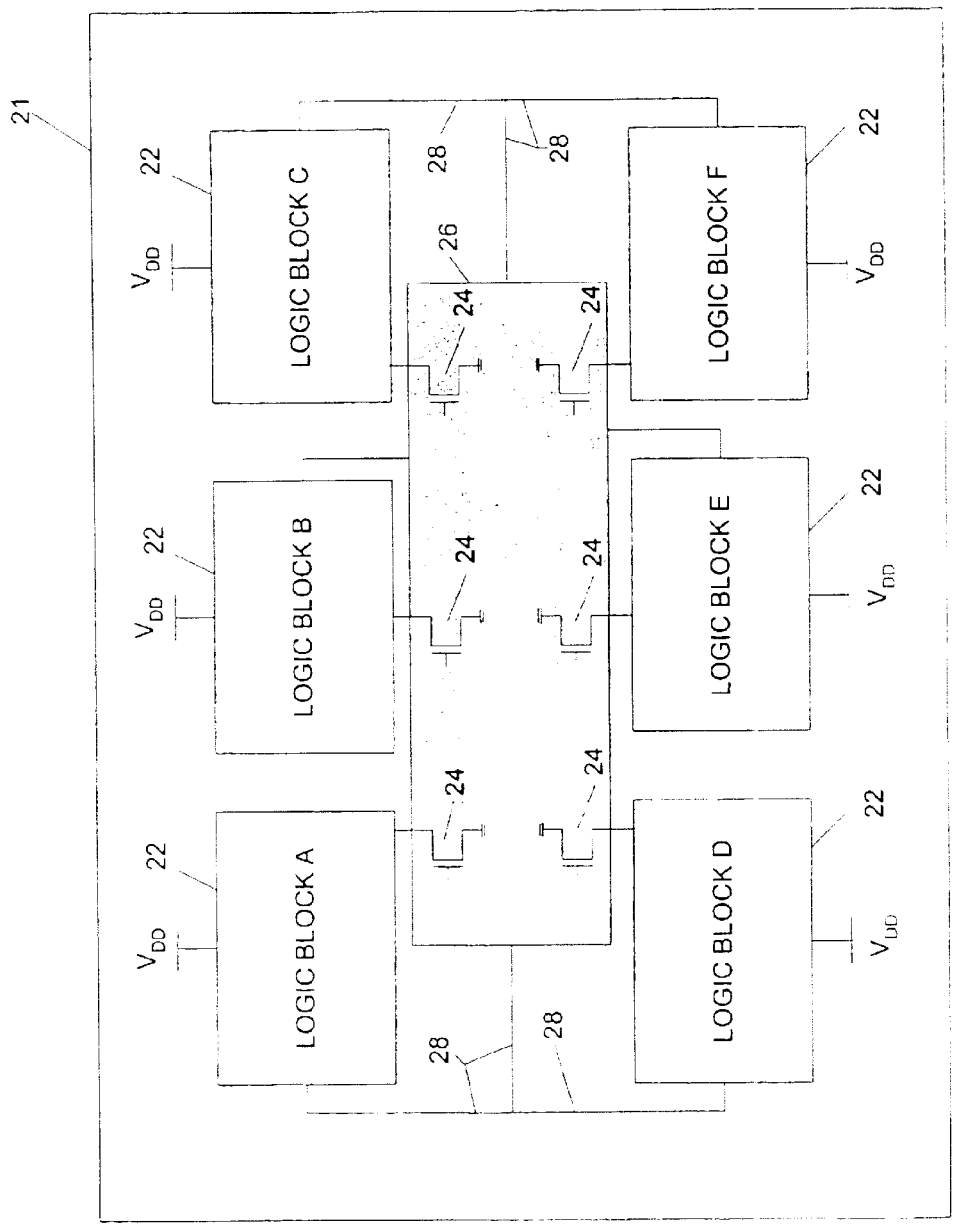
FIG. 3 illustrates a schematic block diagram showing an alternative configuration of a microprocessor having a selective cooling device covering a plurality of standby leakage transistors.

FIG. 3 illustrates another example of an integrated circuit 21 that contains a plurality of digital logic blocks 22 each connected to a standby leakage transistor 24. Here, however, in contrast to the example of FIG. 1, a common cooling device 26 is used to provide cooling for an area of the integrated circuit 21 containing the keeper devices 24. Similar to the example of FIG. 1, the cooling device 26 may be powered from one or more of the logic blocks 22 as indicated by connections 28.

Figure 4:
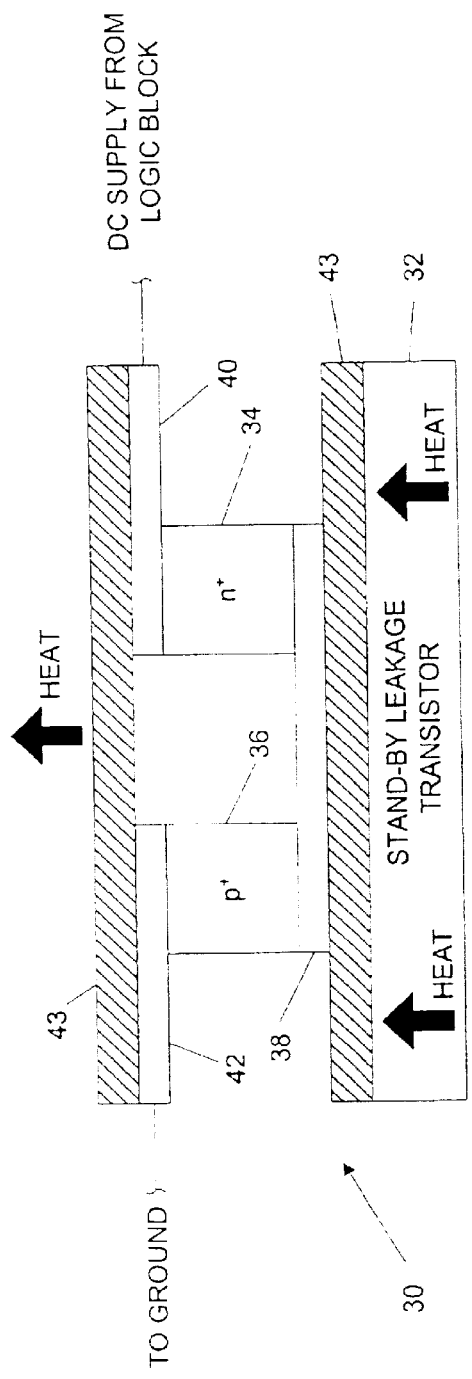
FIG. 4 is a cross-sectional view of an arrangement of a cooling device and a standby leakage transistor.

In the examples of FIGS. 1-3, the cooling devices are embedded within the integrated circuit package over those areas or regions where the keeper devices are located in the microprocessor circuitry. An example of an arrangement utilizing a thermal electric Peltier effect device is illustrated in FIG. 4 in cross-section. A thermal electric cooling device 30 is shown disposed over a region of the microprocessor circuit that includes a standby leakage transistor 32. The thermal electric cooling device 30 utilizing the Peltier effect includes a block of a first N+ doped material 34 and a block of P+ doped material 36 both disposed on a conductor 38 that creates a circuit between the blocks 34 and 36. Disposed on the blocks 34 and 36 are also conductors 40 and 42 that are connected to a DC power supply and ground, respectively. As indicated in FIG. 4 the DC supply may come from the logic block, as discussed previously. This resultant structure is then placed between electric insulators 43, which are also thermally conductive for transmitting heat.

In operation, a voltage is applied to conductor 40 resulting in electron flow from the ground connected to conductor 42 through the P+ doped block 36, through conductor 38, through N+ doped block 34 to conductor 40. This resultant current causes, because of the Peltier effect, a migration of heat energy from the lower portion of the device to the upper portion of the device 30 as indicated by the directional arrows showing the direction of heat flow. As a result of the heat migration, heat energy in the standby leakage transistor 32 is removed, thereby causing cooling of the transistor 32 to occur.

The amount of cooling of the standby leakage transistors may vary depending on how much energy is input to the cooling device. However, any degree of cooling still presents a beneficial effect on the overall power savings of the integrated circuit. Thus, even if the amount of current that may be supplied by the leakage current from the digital logic blocks results in a small amount of cooling, even this small degree of cooling is beneficial in reducing the overall power consumption.

Figure 5:
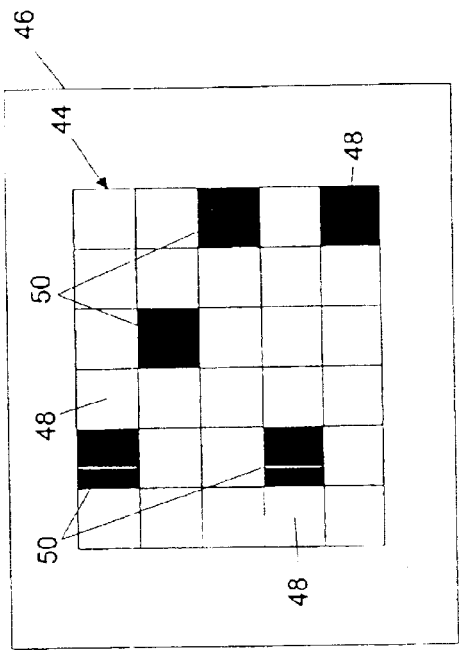
FIG. 5 is a top plan view of a microprocessor circuit having a cooling device array that selectively cools portions of the microprocessor circuit.

For the purpose of utilizing existing thermal electric devices employing the Peltier effect, an example is given in FIG. 5 wherein a cooling device comprised of an array of smaller Peltier effect devices is illustrated. Typically, known thermal electric cooling devices employing the Peltier effect utilize an array of individual circuits each similar to the circuit illustrated in FIG. 4. A modification of these known cooling devices can be effected wherein individual devices in the array may be selectively turned on to provide cooling in designated portions of the array. As shown, the cooling device 44 overlays a microprocessor circuit 46 that is included in an integrated circuit package. The cooling device 44 includes of an array of individual thermal electric cooling circuits 48, which may be selectively turned on and off. From these individual circuits 48, individual ones of the circuits, indicated by reference number 50, are selectively designated to cool portions of the microprocessor 46 underlying those particular thermal electric devices. Typically, the areas of the microprocessor 46 underlying the selected thermal electric devices 50 correspond to areas containing standby leakage transistors. Moreover, the arrayed cooling device 44 may be configured such that power for the individual thermal electric cooling devices 48 in the array that cool respective standby leakage transistors are powered by the associated logic blocks, similar to the example of FIG. 1. Alternatively, the entire cooling device array 44 may simply be powered by one or more of the logic blocks within the microprocessor 46 similar to the power scheme of the example illustrated in FIG. 3.

It is noted that the presently disclosed apparatus and methods are not limited to use with microprocessors or integrated circuits, but may be applied to various semiconductor circuits and circuit packages. For example, selective cooling may be applied to transistors on a printed circuit board in order to minimize power consumption of the transistors.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims, either literally or under the doctrine of equivalents.

What is claimed is:

1. For use with an integrated circuit including a logic circuit, an apparatus for reducing leakage current comprising:

a switching device disposed in a first area of the integrated circuit to selectively switch the logic circuit into a standby mode;

a cooling device disposed in the first area of the integrated circuit to cool the switching device; and a connector to deliver power from the logic circuit to the cooling device.

2. An apparatus as defined in claim 1, wherein the logic circuit comprises a portion of a processor.

3. An apparatus as defined in claim 1, wherein the standby state comprises a disabled state wherein the logic circuit is not clocked.

4. An apparatus as defined in claim 1, wherein the switching device comprises a transistor to receive a switching input signal to selectively toggle the transistor between on and off states.

5. An apparatus as defined in claim 4, wherein the transistor is an NMOS transistor having a first terminal connected to a ground potential, a second terminal connected to the logic circuit and a third terminal to receive the switching input signal.

6. An apparatus as defined in claim 4, wherein the transistor is disposed between the logic circuit and a ground potential and serves to selectively connect the logic circuit to ground potential.

7. An apparatus as defined in claim 1, wherein the cooling device comprises a thermoelectric circuit.

8. An apparatus as defined in claim 7, wherein the thermoelectric circuit comprises a Peltier device.

9. An apparatus as defined in claim 7, wherein the thermoelectric circuit comprises an array of Peltier devices and each of the Peltier devices can be selectively turned on to effect cooling in particular areas of the array.

10. An apparatus for reducing power leakage in a circuit package comprising:
   a processor including a first logic circuit;
   a first switching circuit connected between the first logic circuit and a first voltage;
   a first cooling device disposed in an area adjacent to the first switching circuit and configured to selectively cool the first switching circuit; and
   a first connector to deliver power from the first logic circuit to the first cooling device.

11. An apparatus as defined in claim 10, wherein the first logic circuit comprises a microprocessor logic block.

12. An apparatus as defined in claim 10, wherein the first cooling device comprises a thermoelectric circuit that is embedded within the circuit package in the area adjacent to the first switching circuit.

13. An apparatus as defined in claim 10, wherein the first switching circuit is configured to selectively switch the first logic circuit between active and standby states.

14. An apparatus as defined in claim 10, wherein the first switching circuit comprises a transistor.

15. An apparatus as defined in claim 14, wherein the transistor is an NMOS transistor and the first voltage is ground voltage.

16. An apparatus as defined in claim 14, wherein the transistor is a PMOS transistor and the first voltage is a supply voltage providing power to the first logic circuit portion.

17. An apparatus as defined in claim 10, wherein the first cooling device is a plurality of cooling circuits.

18. An apparatus as defined in claim 17, wherein the cooling circuits can be independently switched on and off.

19. An apparatus as defined in claim 10, wherein the processor comprises a second logic circuit and further comprising:
   a second switching circuit associated with the second logic circuit; and
   a second cooling device disposed in an area above the second switching circuit to selectively cool the second switching circuit.

20. An apparatus as defined in claim 10, wherein the processor comprises a second logic circuit and further comprising:
   a second switching circuit associated with the second logic circuit;
   a second cooling device disposed in an area above the second switching circuit to selectively cool the second switching circuit; and
   a second connector to deliver power from the second logic circuit to the second cooling device.

21. A method for reducing power leakage in a processor comprising:
   disposing a cooling device in a vicinity of a switching circuit, the switching circuit being used to maintain a logic circuit associated with the processor in a stand-by state;
   powering the cooling device with power from the logic circuit; and cooling the switching circuit with the cooling device.

22. A method as defined in claim 21, wherein the cooling device is a thermoelectric circuit.

23. A method as defined in claim 22, wherein the thermoelectric circuit comprises a Peltier device.

* * * * *